(12) United States Patent
Zoorob

(10) Patent No.: US 6,959,127 B2
(45) Date of Patent: Oct. 25, 2005

(54) OPTICAL DEVICE

(75) Inventor: Majd Zoorob, Southhampton (GB)

(73) Assignee: Mesophotonics Limited, Southampton (GB)

( * ) Notice: Subject to any disclaimer, the term of this patent is extended or adjusted under 35 U.S.C. 154(b) by 176 days.

(21) Appl. No.: 10/609,673

(22) Filed: Jul. 1, 2003

(65) Prior Publication Data

US 2005/0100296 A1 May 12, 2005

Related U.S. Application Data

(63) Continuation-in-part of application No. 10/185,727, filed on Jul. 1, 2002, now abandoned.

(51) Int. Cl.[7] .................................................. G02B 6/26
(52) U.S. Cl. ............................ 385/16; 385/129; 372/7; 372/92
(58) Field of Search ........................... 385/16, 129, 130, 385/14; 372/7, 92

(56) References Cited

U.S. PATENT DOCUMENTS

| | | | |
|---|---|---|---|
| 6,278,105 B1 | 8/2001 | Mattia | |
| 6,618,535 B1 | 9/2003 | Reynolds | |
| 6,683,898 B2 | 1/2004 | Ostergaard et al. | |
| 2002/0041749 A1 | 4/2002 | Johnson et al. | |
| 2003/0080921 A1 | 5/2003 | Wen et al. | |

FOREIGN PATENT DOCUMENTS

| | | |
|---|---|---|
| EP | 0 836 112 | 4/1998 |
| EP | 1 205 788 | 5/2002 |
| WO | WO 01/77726 | 10/2001 |
| WO | WO 02/25781 | 3/2002 |

OTHER PUBLICATIONS

Zoorob et al, "Complete Photonic Bandgaps in 12–Fold Symmetric Quasicrystals" *Nature*, vol. 404, Apr. 2000, pp. 740–743.
Radin, "Symmetry and Tilings" *Notices of the AMS*, vol. 42, No. 1, Jan. 1995, pp. 26–31.
Krauss et al, "Photonic Crystals in the Optical Regime—Past, Present and Future" *Progress in Quantum Electronics*, vol. 23, No. 2, 1999, pp. 51–96.
Cao et al, "Microlaser Made of Disordered Media" *Applied Physics Letters*, vol. 76, No. 21, May 2000, pp. 2997–2999.
Jin et al, "Band Gap and Wave Guiding Effect in a Quasi-periodic Photonic Crystal" *Applied Physics Letters*, vol. 75, No. 13, Sep. 1999, pp. 1848–1850.
Zoorob et al, "Complete and Absolute Photonic Bandgaps in Highly Symmetric Photonic Quasicrystals Embedded in Low Refractive Index Materials" *Materials Science and Engineering*, vol. 74, No. 1–3, May 2000, pp. 168–174.
C. Radin, "The Pinwheel Tilings of the Plane" *Annals of Mathematics*, 1991, pp. 1–43.

*Primary Examiner*—Sung Pak
(74) *Attorney, Agent, or Firm*—Nixon & Vanderhye P.C.

(57) ABSTRACT

An optical device is provided including an optically localising region comprising a first region having a first refractive index and an array of sub-regions having a second refractive index, the sub-regions in the array positioned at each of the vertices of the triangles in a pinwheel tiling structure. Light passing through the optical device is localised by multiple scattering events within the localising region. The localising region is isotropic so that transmission in the same in all directions and strong localisation occurs for a relatively broad band of frequencies. This is beneficial in a number of applications. The structure can be easily replicated and that there is always a set minimum spacing between the sub-regions.

24 Claims, 9 Drawing Sheets

Large Pinwheel Quasicrystal Structure (38x42)

Small Pinwheel Quasicrystal Structure (17x26)

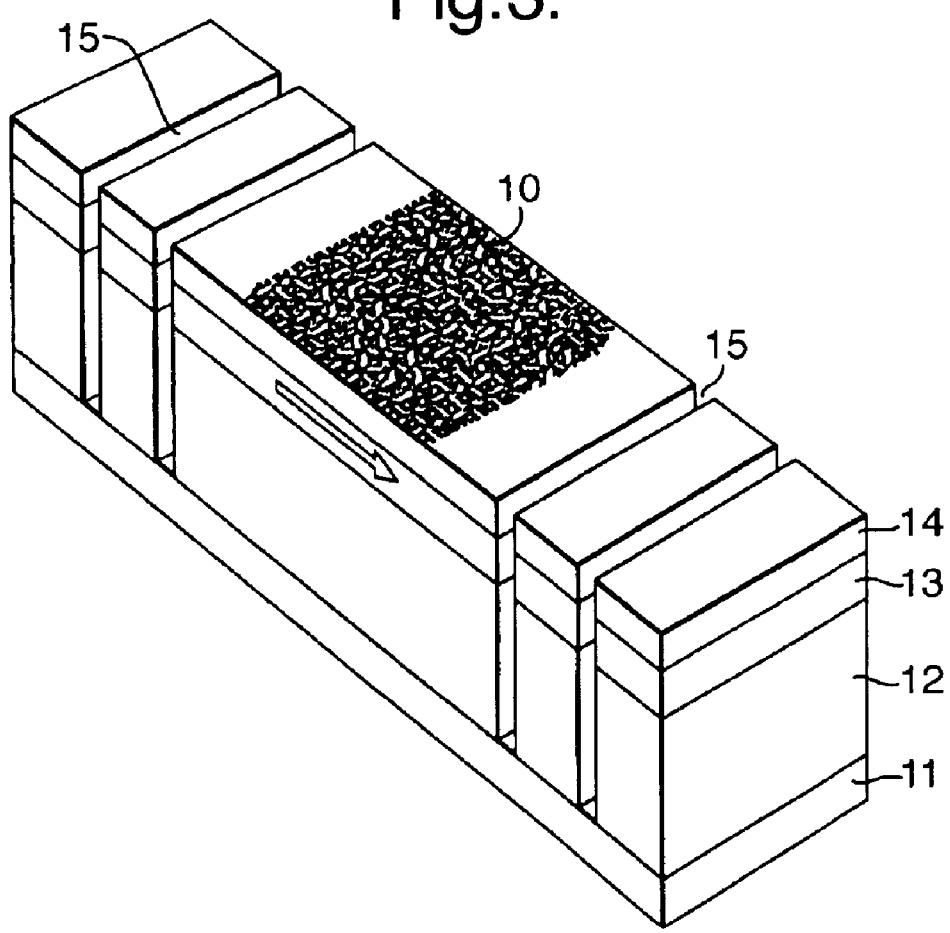

OPTICAL DEVICE

This application is a continuation-in-part of application Ser. No. 10/185,727, filed Jul. 1, 2002 which is now abandoned, the entire content of which is hereby incorporated by reference in this application.

FIELD OF THE INVENTION

The present invention relates to optical devices incorporating a localising region which strongly localises photons.

BACKGROUND TO THE INVENTION

Lasers work on the principle of stimulated emission. This requires light of the correct frequency to impinge on excited atoms in the lasing region. In order to get an efficient laser the light must stimulate emission from as many of the excited atoms as possible. Conventionally, this is achieved by using a resonant cavity with mirrored ends so that the stimulating light undergoes multiple reflections and makes multiple passes of the lasing region. This arrangement results in a typical efficiency of only a few percent as much of the energy is lost out of the sides of the laser cavity and the mode in the cavity is unstable. In order to obtain even this low level of efficiency, the resonant cavity must be accurately produced in order to ensure that a standing wave is set up.

Some potential laser materials are not able to lase using a conventional apparatus because the lifetime of the excited states are too short to allow a population inversion to be sustained. It would be desirable to find an alternative arrangement that allowed these materials to lase.

Recently, work has been carried out investigating the lasing properties of random media, such as a powdered lasing glass. Random media of this sort give rise to strong scattering and interference which can act to trap light or at least strongly localise it. The multiple scattering events can be used to stimulate many atoms in a single pass of the material. It is therefore possible to use such random media in lasers without the need for resonant cavities.

However, there are problems associated with such random media. They are difficult to define and replicate and can give rise to anisotropic behaviour. Furthermore, it is difficult to predict the localising wavelength in a random structure. It is often specific to a particular wavelength and a particular direction of propagation.

SUMMARY OF THE INVENTION

According to the present invention, an optical device includes an optically localising region comprising a first region having a first refractive index and an array of sub-regions having a second refractive index, the array having a pinwheel tiling structure defined by a plurality of similar triangles, such that the sub-regions in the array are positioned at vertices of the triangles defining the pinwheel tiling structure.

Pinwheel tiling in a plane is well known in the field of mathematics, and in particular the field of aperiodic tiling, and is sometimes referred to as a Conway decomposition. Further detail on pinwheel tiling in the plane can be found in "The pinwheel tilings of the plane" by Charles Radin, Annals of Math. 139(1994), 661–702.

In the context of the present invention, light passing through the optical device is localised by multiple scattering events within the localising region. The localising region is isotropic so that transmission is the same in all directions and strong localisation occurs for a relatively broad band of frequencies. This is beneficial in a number of applications. Furthermore, using a pinwheel structure ensures that the structure can be replicated and that there is always a set minimum spacing between the sub-regions. This is not the case for random structures, which can include undesirable overlapping of sub-regions. If the sub-regions overlap, the shape of the sub-regions are distorted and are difficult to define. Nor is the case for amorphous materials. Amorphous materials have a base structure with a fixed lattice spacing but the lattice points are randomly rotated with respect to each other. This gives rise to a weak photon interaction but not localization.

Preferably, the localising region is formed in a planar waveguide structure. Preferably, the array of sub-regions comprises a plurality of holes which are formed in the first material.

In one aspect of the present invention, the first region is formed from a luminescent material. Preferably, the optical device is a laser device with the localising region formed in a lasing cavity. The localising region reduces the required accuracy to which the lasing cavity must be made. The laser device may be a planar waveguide structure including a cladding layer and a core layer, with the pinwheel structure etched through the cladding layer and the core layer.

Preferably, the lasing cavity includes lasing mirrors at opposite ends. The lasing mirrors may be formed by slots cut into the core and the cladding or may be external mirrors. Lateral confinement can also be provided by slots cut into the core and the cladding.

Alternatively, lasing mirrors and lateral confinement can be provided by an array of external sub-regions formed in the waveguide core, the array of external sub-regions giving rise to a photonic bandgap. The external array can be a 1-dimensional array of slots cut into the core or may be a 2-dimensional array. Preferably, the external array includes a defect giving rise to a narrow pass band within the photonic bandgap.

The present invention is applicable to applications other than lasers. According to another aspect of the invention, the first region is formed of an optically nonlinear material. Preferably, the optical device further comprises an optical input and an optical output, wherein the optically localising region exhibits a photonic bandgap, the wavelength range of the photonic bandgap being dependent on the refractive index of the first region.

The optical device according to this aspect may be used as a clock, wherein an optical signal of constant amplitude having a wavelength lying inside the bandgap is incident on the optically localising region and is localised thereby; and wherein a change in refractive index of the first: region, caused by an accumulation of the localised optical signal, causes the bandgap to change such that the optical signal lies outside the band gap.

The optical device may alternatively be a switch and include an optical data input, an optical data output and a control input, wherein, in use, a control signal effecting a change in refractive index of the first region is input via the control input so as to alter the photonic bandgap, to control whether or not the optical data signal is able to pass from the optical data input through the localising region to the optical data output. The control signal is preferably an optical signal but may be an electrical signal, a magnetic signal or an acoustic signal.

According to a further aspect of the present invention the optical device may be used as an optical absorber over a range of wavelengths.

According to yet a further aspect of the invention, the optical device may be a light emitting diode (LED) wherein the first region is formed from an active material or active multilayer, the LED further comprising an electrode structure for applying an electric potential across the first region so as to induce emission.

According to a still further aspect of the present invention, a method of processing an optical signal, comprises the step of passing the optical signal through an optical device including an optically localising region comprising a first region having a first refractive index and an array of sub-regions having a second refractive index, the array having a pinwheel tiling structure defined by a plurality of similar triangles, such that the sub-regions in the array are positioned at vertices of the triangles defining the pinwheel tiling structure.

The first region may be formed from a nonlinear material, the method further comprising the step of applying a control signal to the optically localising region to affect its optical response.

If the first region is formed from a nonlinear material, the optically localising region has a photonic bandgap and the optical signal is of constant amplitude having a wavelength lying inside the bandgap then the method could be used to produce a clock signal. A change in refractive index of the first region, caused by an accumulation of the localised optical signal, causes the bandgap to change such that the optical signal lies outside the band gap, giving rise to a pulsed output signal.

The method is also applicable to lasing and amplifying applications when the first region is formed from a luminescent material.

According to another aspect of the present invention, a method of manufacturing an optical device including an optically localising region comprises the steps of:

providing a first region having a first refractive index; and providing an array of sub-regions having a second refractive index, the array having a pinwheel tiling structure defined by a plurality of similar triangles, such that the sub-regions in the array are positioned at vertices of the triangles defining the pinwheel tiling structure.

BRIEF DESCRIPTION OF THE DRAWINGS

Examples of the present invention will now be described in detail with reference to the accompanying drawings, in which:

FIG. 3 shows a laser design according to one embodiment of the present invention;

DETAILED DESCRIPTION

Planar photonic bandgap structures are known in the art and have been used for the construction of waveguides in integrated optical circuits. Planar photonic bandgap structures can be provided by forming a lattice of holes in a dielectric substrate. The geometry of the lattice and the properties of the dielectric material determine a photonic band structure for the device. WO98/53551 describes planar photonic band structures of this type and how they can be produced. WO01/77726 describes particular quasiperiodic geometries for the lattice of holes in these structures.

Figure 1:
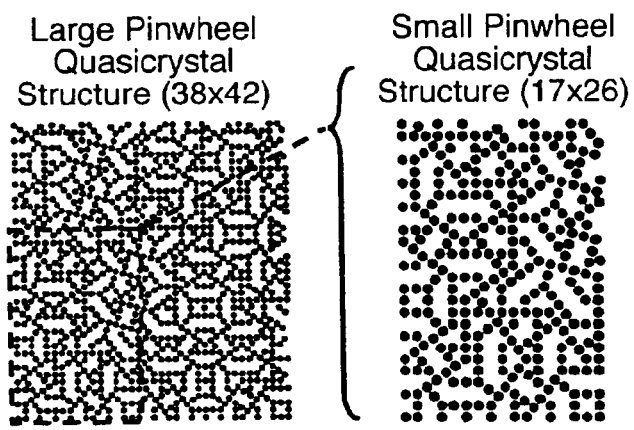
FIG. 1 is a schematic representation of a planar photonic crystal with a pinwheel structure in accordance with the present invention.
Figure 2:
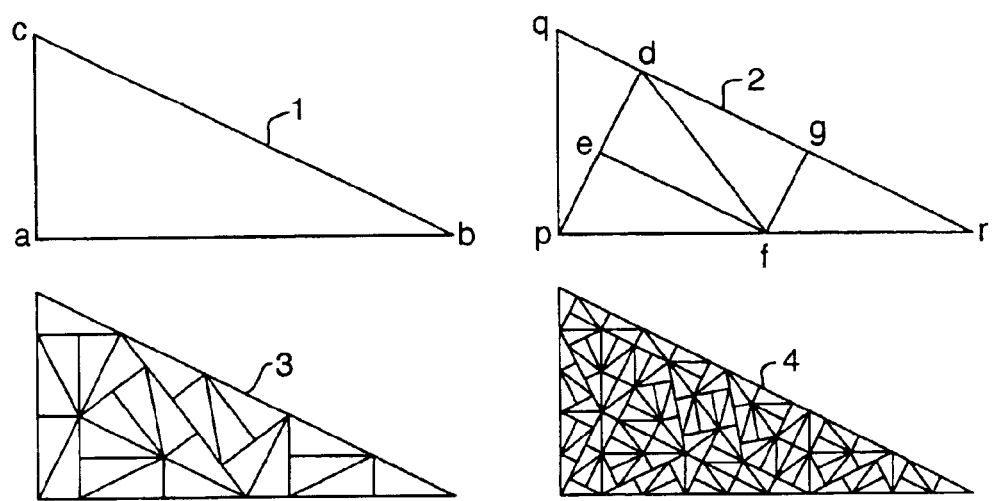
FIG. 2 shows a pinwheel tiling structure in more detail.

A lattice of holes formed in a dielectric substrate positioned at the vertices of the triangles in a pinwheel tiling structure is shown schematically in FIG. 1. The pinwheel tiling is explained in more detail with reference to FIG. 2. The pinwheel tiling structure is formed from a right-angled triangle 1 having side lengths in the ratio 1:2:o5. This triangle can be divided into 5 smaller, similar triangles 2 in a unique way as shown. Similar in this context means that the internal angles of the triangles are identical but the length of the sides may be different. Each of the smaller triangles are identical to each other and similar to the "parent" triangle. Iteration of this division process to each of the smaller triangles yields the pinwheel tiling structure 3, 4. This relates to the optical device shown in FIG. 1 in that each hole in FIG. 1 is drilled or etched into the substrate at the vertex of a triangle in a pinwheel structure. The pinwheel structure shown in FIG. 1 is the result of 6 iterations.

When using the pinwheel structure in a device only a section of the total pattern need be taken. Two sections are shown, the larger section is 38×42 periods and the smaller section is 17×26 periods, where a period is defined as the minimum spacing between holes. The choice of a particular section is explained in more detail below.

The position of the points can be calculated and plotted using a simple program in a suitable piece of software, such as Mathematica. A suitable program is given in the attached Appendix, together with commentary.

One property of putting lattice points at the vertices of the triangles in the pinwheel structure is that each generation of triangle dissections provides a new set of lattice planes. This is due to the fact that the rotation angle for each iteration is an irrational number. Therefore, an infinite number of iterations of the triangle dissection lead to an infinite number of lattice planes. For this reason the lattice formed in this way has a highly isotropic response to incident radiation. The diffraction pattern generated by the structure reveals a continuum surrounding a central Bragg spot. By contrast, photonic crystal structures have, as their name suggests, a crystalline structure with well defined symmetry and hence a diffraction pattern of well defined spots. The periodic structure of photonic crystals gives rise to a strong and well defined photonic band structure and photonic band gaps analogous to the electronic band structure found in periodic semiconductor crystals. The pinwheel structure of the present invention departs from this periodic type of structure and gives rise to features with no analogy in semiconductor physics.

It is also the case that due to many of the lattice planes not being parallel, coherent back scattering and constructive interference is much weaker in the pinwheel structure than in photonic crystal structures. As mentioned above, owing to the iterative method for the formation of the pinwheel structure, each new iteration introduces, a new set of rotation angles for the planes formed by the new lattice points. Additionally, new planes which possess the same rotation angles as previous iterations provide increased interaction length for light along that specific direction. The size of the structure is significant, with larger pinwheel structures exhibiting stronger localisation. For practical devices, such as those described below, the pinwheel structure should include at least 40 periods.

The pinwheel structure exhibits strong localisation effects across a large frequency range. The actual frequency range at which strong localisation occurs is dependent on a number of parameters associated with the pinwheel structure, such as the spacing between holes, the refractive index of the materials used in the core, buffer and cladding layers, the filling fraction of the holes and the substance filling the holes. The response may also be tuned by altering the ambient conditions, for example the temperature, or by using materials whose refractive index or size is variable upon application of a potential difference. Also significant is the section of the pinwheel structure that is selected for the localising region in a device.

Typically a rectangular region is selected starting from the shortest edge of the original parent triangle. In order to obtain a sufficient distribution of lattice planes to ensure symmetry in the selected area, the use of a suitable number of iterations in the generation of the pattern is required. If the iteration number is large then more rods are required in the selected area to ensure a symmetrical sample. If only two or three iterations are used the localisation effects are too small to be of practical use. Between 4 and 8 iterations are preferred. 6 iterations has been found to be suitable for the embodiments of the invention herein described. 6 iterations leads to 11249 rods or vertices in the pinwheel pattern from which, for example, an area of 38×42 rods can be taken to form an effective localising region.

The strong localisation effects can be usefully employed in the design of amplifiers and lasers. FIG. 3 shows a first design for a laser incorporating a pinwheel structure region 10. The laser comprises a waveguide structure having a substrate 11 on which a buffer layer 12 is formed, which in turn supports a core layer 13. The core layer 13 is covered by a cladding layer 14. The buffer and cladding layers 12,14 are formed from oxide, such as silicon oxide, and the core layer 13 is formed from a lasing material, for example a rare-earth doped dielectric material such as erbium doped tantalum pentoxide, silicon nitride, silicon oxynitride or a lasing material such as gallium arsenide or indium phosphide. A pinwheel quasicrystal pattern 10 is etched through the cladding 14 and into the core 13. The pattern is as described above, with holes formed at the vertices of the triangles in a pinwheel tiling scheme. On either side of the pinwheel pattern slots 15 are etched through the cladding 14 and core layers 13 to provide lasing mirrors that define the laser cavity. The pinwheel pattern 10 provides enhanced localisation of the light in the laser cavity and hence allows the laser cavity to be made shorter than in conventional devices. Furthermore, the high localisation provided by the pinwheel structure reduces the level of accuracy to which the dimensions of the laser cavity must be made.

Figure 4A:
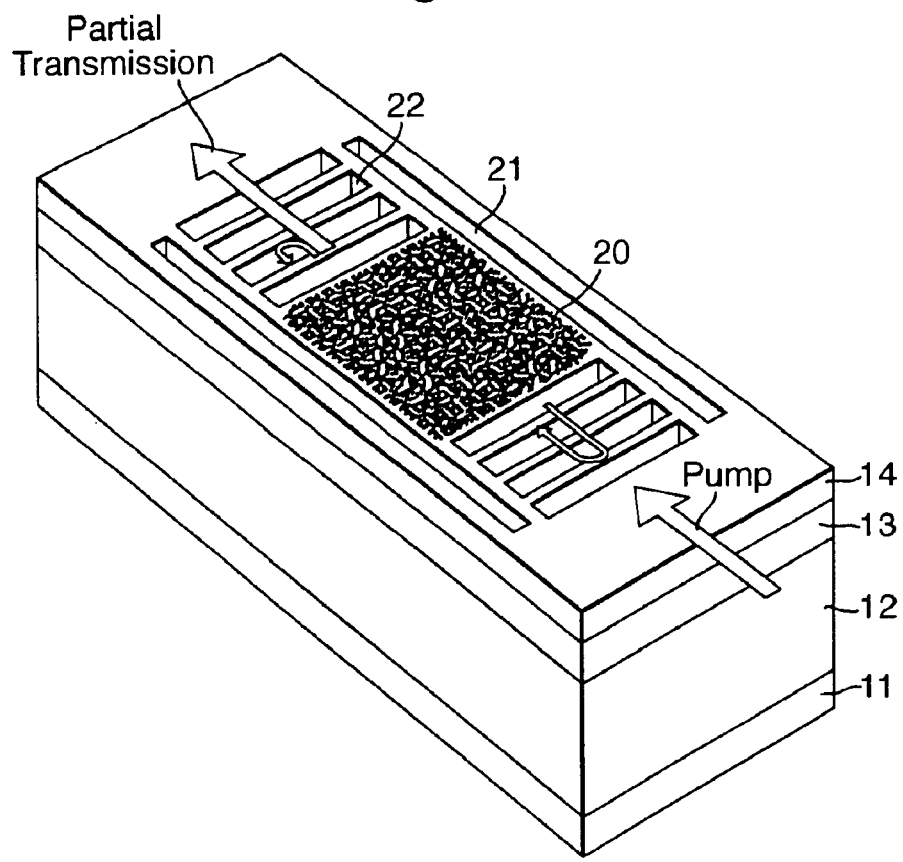
FIG. 4a shows a laser design according to a second embodiment of the present invention.
Figure 4B:
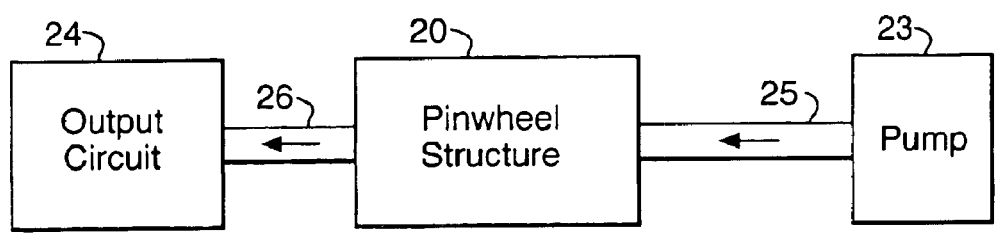
FIG. 4b shows the laser of FIG. 4a in an integrated optical circuit.

FIG. 4a shows another laser design incorporating a pinwheel pattern 20. Again, the benefit of the pinwheel pattern is that it allows for a short laser cavity. The design incorporates etched grooves 21 to laterally confine light in the laser cavity. Etched slots 22 act as partial reflectors to longitudinally confine light. However, in this design there are a greater number of spaced slots at either end. The slots form, in effect, a 1-dimensional photonic crystal having a photonic bandgap which forbids light having a wavelength within the bandgap from propagating through it. The device is optically pumped at one end and a coherent beam is formed by partial transmission at the other end. The device can be simply included in an integrated optical circuit as shown in FIG. 4b. The pump 23 provides a pump signal to the pinwheel structure 20 via an input waveguide 25. The coherent output beam is coupled to an output optical circuit 24 via an output waveguide 26.

Figure 5:
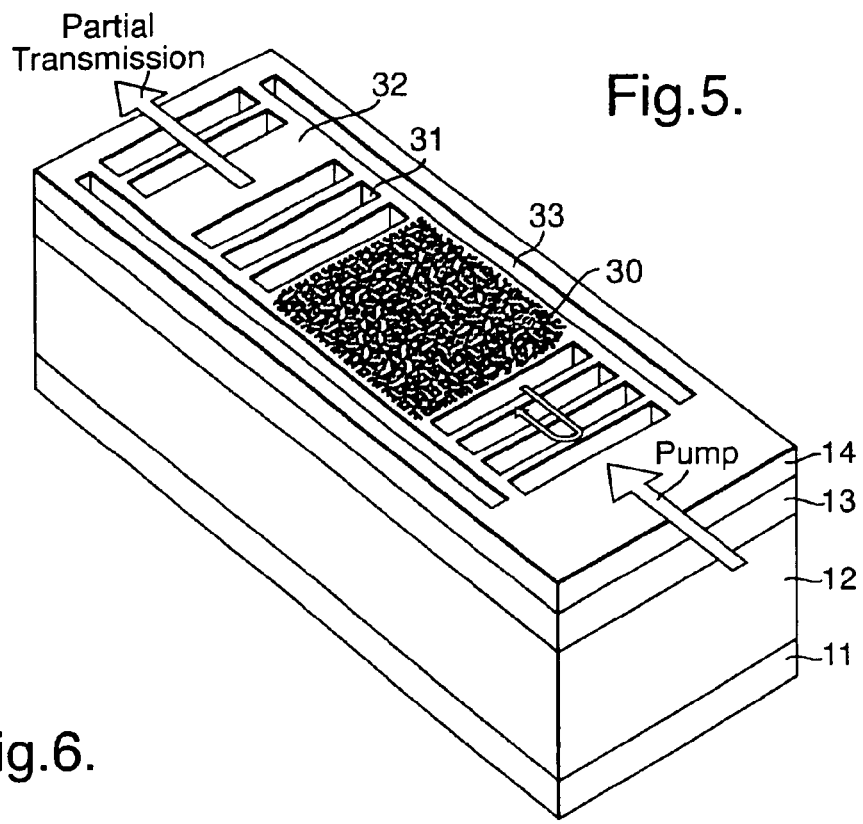
FIG. 5 shows a laser design according to a third embodiment of the present invention.

FIG. 5 shows a similar design to FIG. 4 but with a modified arrangement of reflecting slots 31. The structure again includes a pinwheel structure 30, reflecting slots 31 and confining slots 33. A shift 32 in the distribution of the slots 31 provides a defect state in the photonic crystal structure formed by the slots 31, which gives rise to a narrow passband within a photonic bandgap. Matching the wavelength of the narrow passband to one of the spectral lines of the lasing material of the core layer allows a narrow linewidth laser to be formed.

Figure 6:
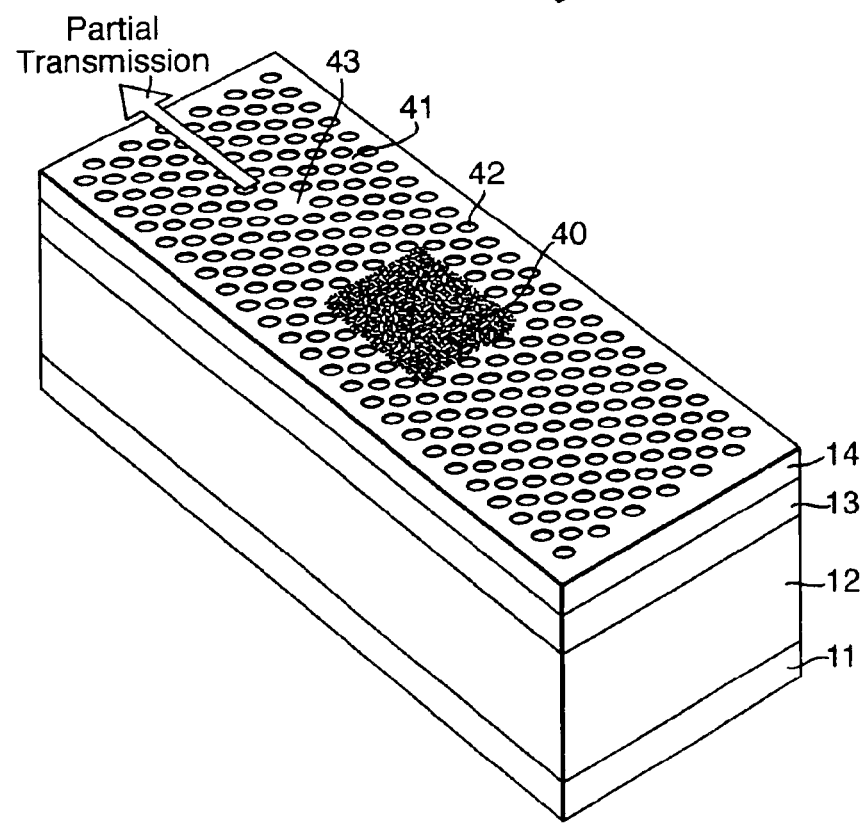
FIG. 6 shows a laser design in accordance with a fourth embodiment of the present invention.

FIG. 6 shows a further laser design incorporating a pinwheel structure 40. Again the laser is based on a planar waveguide structure including substrate, buffer, core and cladding layers. A pinwheel tiling structure region 40 is formed in the cladding and core layers. Surrounding the pinwheel region 40 is a photonic band structure region 41 formed from an array of holes 42 etched through the cladding and core layers. The photonic band structure region 41 has a photonic bandgap including the lasing wavelengths. However, a defect 43 is included in the array of holes 42 giving rise to a narrow passband at one lasing wavelength in the desired direction of propagation of an output beam. The pinwheel structure and the photonic band structure region can be tuned to give the desired response by altering one or more of a number of parameters, including the filling fraction of the holes, the spacing of the holes, the shape of the holes and the geometry of the photonic band structure region. The holes of the photonic band structure region may be filled with a different substance to the holes in the pinwheel structure region and they may be of a different size and/or shape. The important thing is that the pinwheel structure exhibits strong localisation at the same wavelength as the passband of the photonic bandgap structure, and that this is a lasing wavelength of the core material.

Figure 7A:
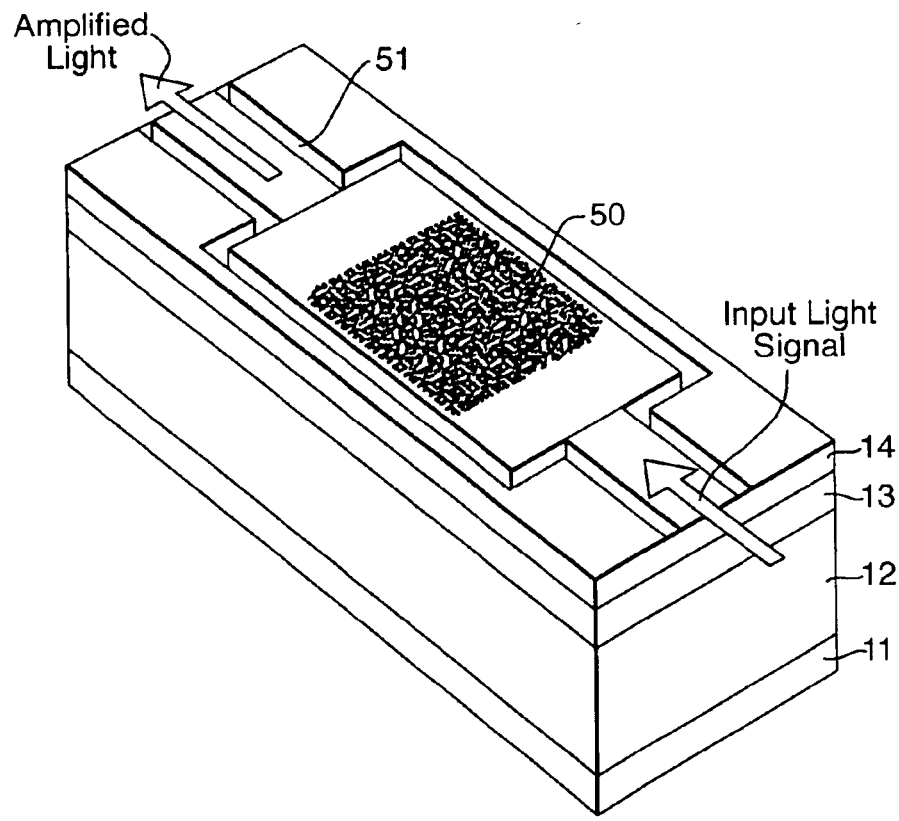
FIG. 7a shows an amplifier in accordance with a fifth embodiment of the present invention.

FIG. 7a shows an amplifier design incorporating a pinwheel tiling structure region 50. The pinwheel structure consists of an array of holes etched through the cladding layer and the core layer. The core layer is formed from a photo-luminescent material, for example a rare-earth doped dielectric material such as erbium doped tantalum pentoxide, silicon nitride, silicon oxynitride or a lasing material such as gallium arsenide or indium phosphide. Etched grooves 51 confine light in the waveguide. The strong localisation of light in the pinwheel structure means that a given amount of amplification by stimulated emission can be achieved in a much shorter length than would otherwise be possible. The pinwheel structure is therefore beneficial in the design of small optical amplifiers.

Figure 7B:
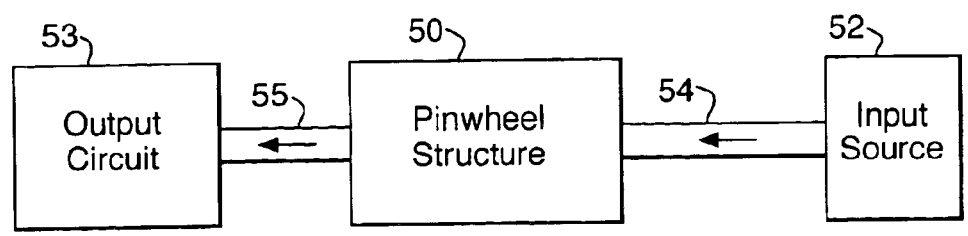
FIG. 7b shows the amplifier of FIG. 7a in an integrated optical circuit.

FIG. 7b shows the amplifier of FIG. 7a in an integrated optical circuit. An input source 52 provides an input signal, via an input waveguide 54, which is amplified by the pinwheel structure 50. The amplified signal output to an optical circuit 53 via an output waveguide 55.

Figure 8A:
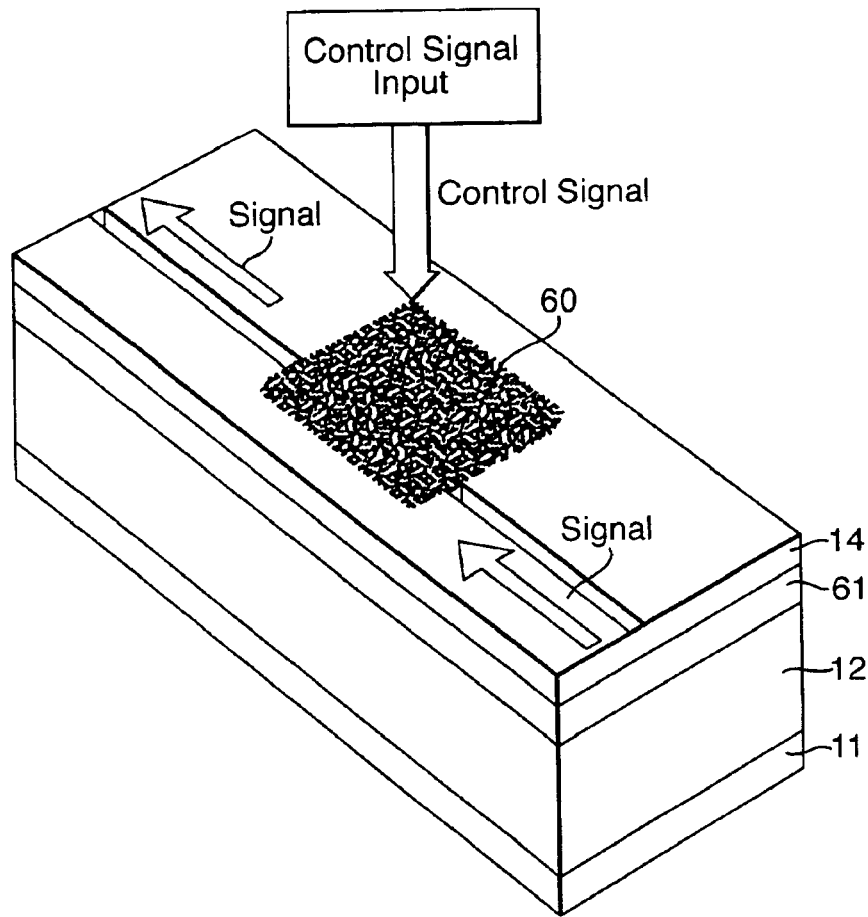
FIG. 8a shows a switch in accordance with a sixth embodiment of the present invention.

FIG. 8a shows a switch design incorporating a pinwheel structure 60 in accordance with the present invention. The core layer 61 of the waveguide is formed from a nonlinear material such as lithium niobate or gallium arsenide. The pinwheel structure possesses spectral regions of reduced density of states, i.e. light in this spectral region is less likely to couple into specific modes. The reduced density of states together with a coupling mismatch prohibits the propagation of a band of wavelengths through the structure. The parameters defining the pinwheel structure and the wavelength of the optical signals incident on the pinwheel structure are chosen such that the wavelength of the optical signal is within, but dose to the edge of, this spectral region and so ordinarily will not pass through the pinwheel region 60 but is instead scattered out of the plane of the structure or absorbed. However, the application of a control signal to the pinwheel region causes a change in the refractive index of the non-linear core material. The change in refractive index alters the response of the pinwheel region and hence the position of the spectral region having a reduced density of states. The response changes such that optical data signal no longer lies in the spectral region having a reduced density of states and so passes through to an output waveguide. The control signal is an optical signal which results in a power build up in the pinwheel region and can be applied from any direction, for example from above. The control signal can be of any wavelength but ideally should not be the same as the data signal. The control signal means 62 is only shown schematically but a suitable means for supplying the control signal is a Ultra Violet Light Emitting Diode (UV LED). As described above, the application of the control signal acts as a switch, allowing the data signal to pass through the pinwheel region. This is one possible set-up out of many. For example, the pinwheel structure could be tuned so as to allow the data signal through when the control signal is not applied and to block the data signal when the control signal is applied. The control signal need not be optical, for example opto-electric materials, such as lithium niobate, undergo a change in refractive index on application of an electric potential. An electric potential could therefore be used to provide the switching action. Similarly, magnetic fields or Surface Acoustic Waves (SAWs) could be used with a suitable choice of material, such as zinc oxide for SAWs. In all cases, when the data signal is not permitted to pass through the pinwheel structure it is scattered but not reflected.

Figure 8B:
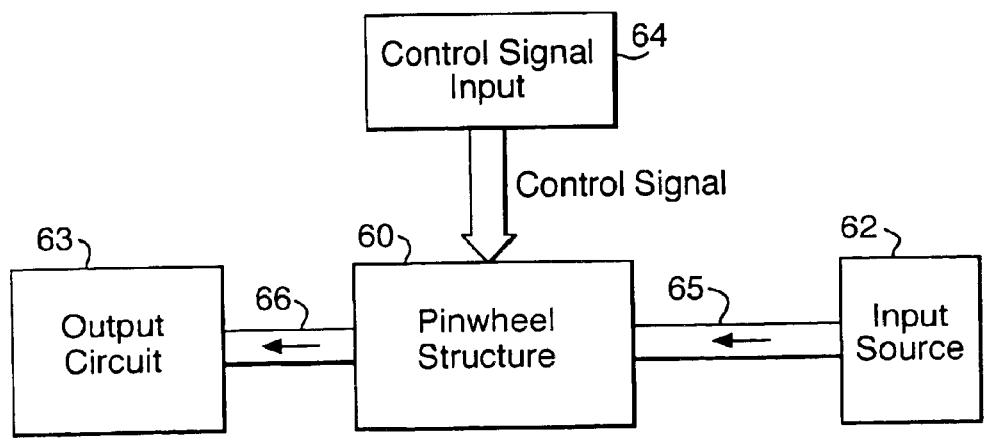
FIG. 8b shows the switch of FIG. 8a in an integrated optical circuit.

FIG. 8b shows the switch of FIG. 8a as part of an integrated optical circuit. The input source 62 provides an input signal to the pinwheel structure 60 via an input waveguide 65, which is selectively passed to an output circuit 63 via the pinwheel structure 60 and an output waveguide 66. The control signal is provided by a control signal input means 64.

Figure 9A:
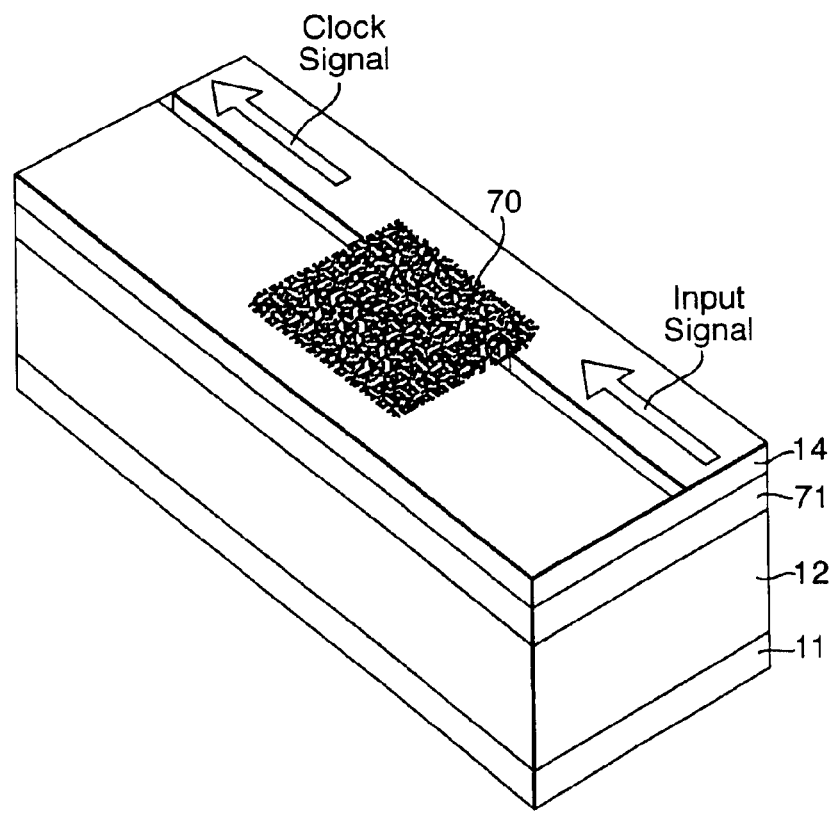
FIG. 9a shows a clock in accordance with a seventh embodiment of the present invention.

FIG. 9a shows a clock device incorporating a pinwheel structure 70 in accordance with the present invention. The core material 71 is nonlinear material such as lithium niobate. An input signal is incident on the pinwheel structure 70. The input signal is a constant amplitude optical signal of a wavelength which lies within a region of reduced density of states in the pinwheel structure 70. The optical signal is highly localised by the pinwheel structure and there is therefore a build of power over time. The refractive index, and hence the spectral response, of the nonlinear material is altered by the power build up until the density of states at the wavelength of the optical signal is increased to the point that the light is no longer localised by the pinwheel structure 70 and is released from the pinwheel structure in a pulse. At least some of this light will be released into an output waveguide. Once the localised light has been released, the refractive index of the core layer returns to its initial level and the whole process begins again. Thus, pulses of light can be produced at regular intervals to form a clock signal. The time constant of the clock signal is dependent on several parameters including the geometry of the pinwheel structure, (i.e. the hole pitch and hole size), the power of the input signal and the size of the pinwheel structure.

Figure 9B:
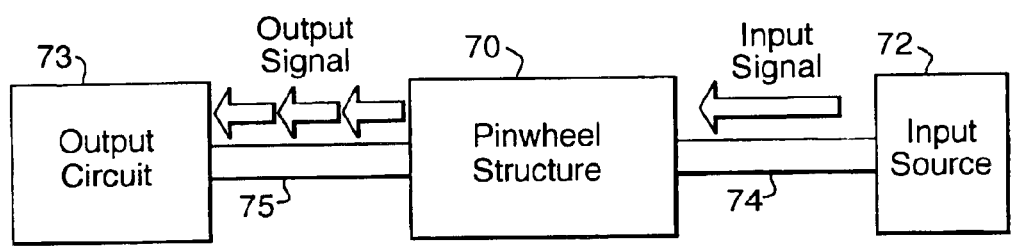
FIG. 9b shows the clock of FIG. 9a in an integrated optical circuit.

FIG. 9b shows the clock of FIG. 9a coupled to an integrated optical circuit. The pinwheel structure 70 is provided with an input signal from an input source 72 via an input waveguide 74. The pulsed output signal is coupled to an integrated optical circuit 73 via an output waveguide 75.

The change in the refractive index with stored power is not the same when the power builds up and when the power is released, i.e. there is a hysteresis in the refractive index of the core layer. This effect can be used to create optical devices with two logical levels, the level depending on whether the pinwheel structure has been powered up or powered down to reach its current state. This can be used to create an optical memory.

Figure 10:
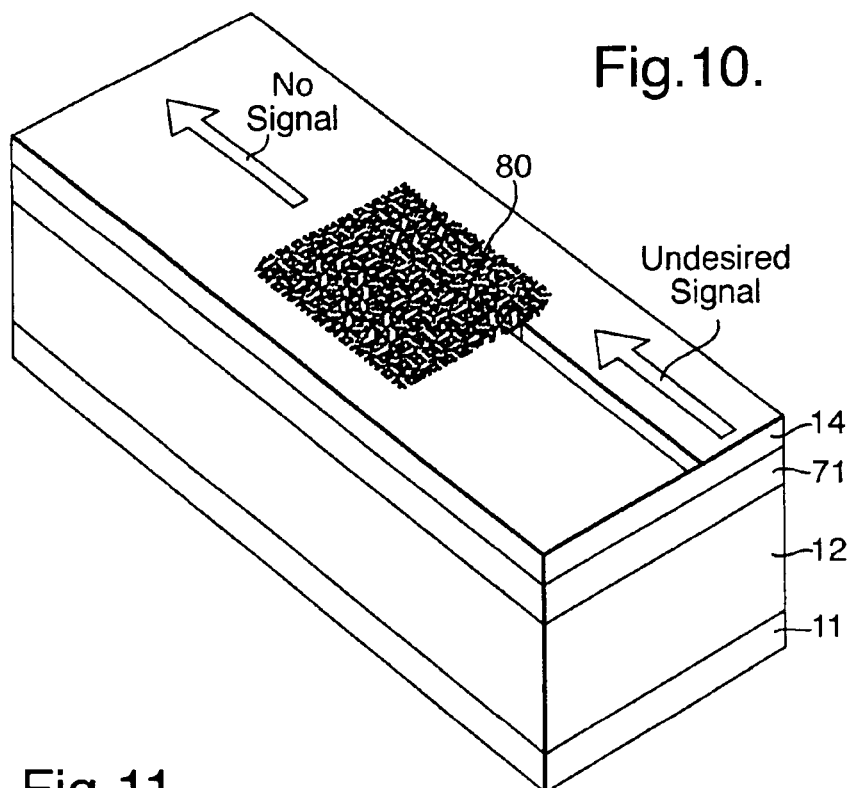
FIG. 10 shows an absorber in accordance with an eighth embodiment of the present invention.

FIG. 10 shows an absorber incorporating a pinwheel structure 80 in accordance with the present invention. The pinwheel structure 80 has a spectral response which has a reduced density of states for some wavelengths which prohibits the transmission through the structure. Instead the pinwheel structure strongly localises light within the wavelength range. It does not reflect light within a band gap range as some photonic crystals do and so is more suitable as an optical absorber.

Figure 11:
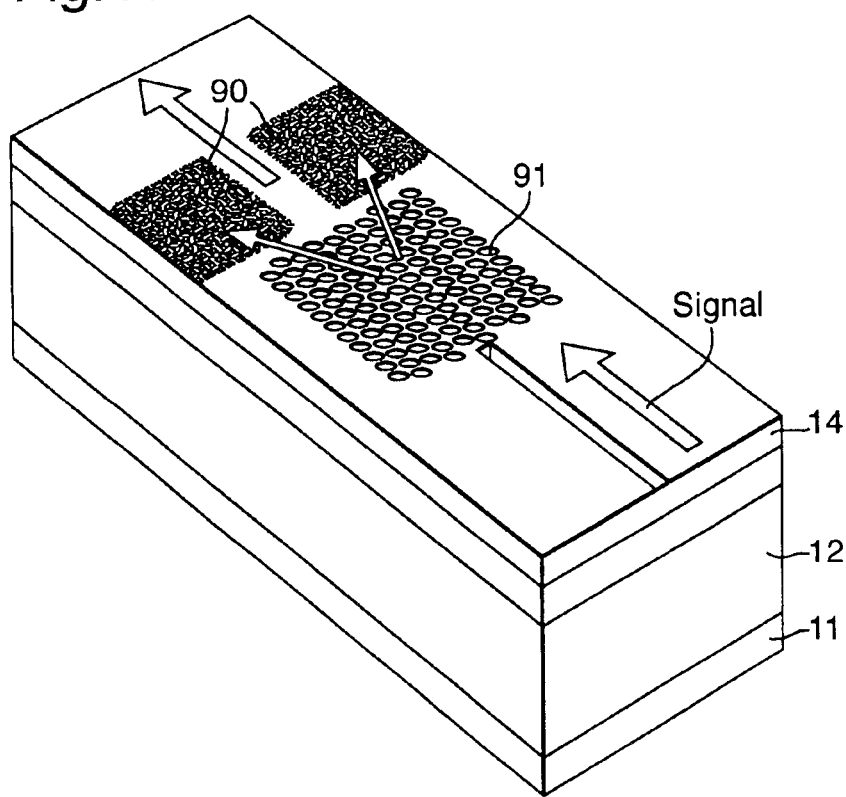
FIG. 11 shows an alternative application of the absorber of FIG. 10.

FIG. 11 shows an application of the pinwheel structure as an optical absorber. An input optical signal is incident on a photonic crystal region 91 which provides for transmission of a desired signal but also gives rise to unwanted diffracted beams. Pinwheel structures 90 are formed in the waveguide structure in the path of the diffracted beams, the pinwheel structure being such that they absorb light at the wavelength of the diffracted beams, as described above. The transmitted beam, which is desired, is allowed to pass to an output waveguide (not shown).

Figure 12:
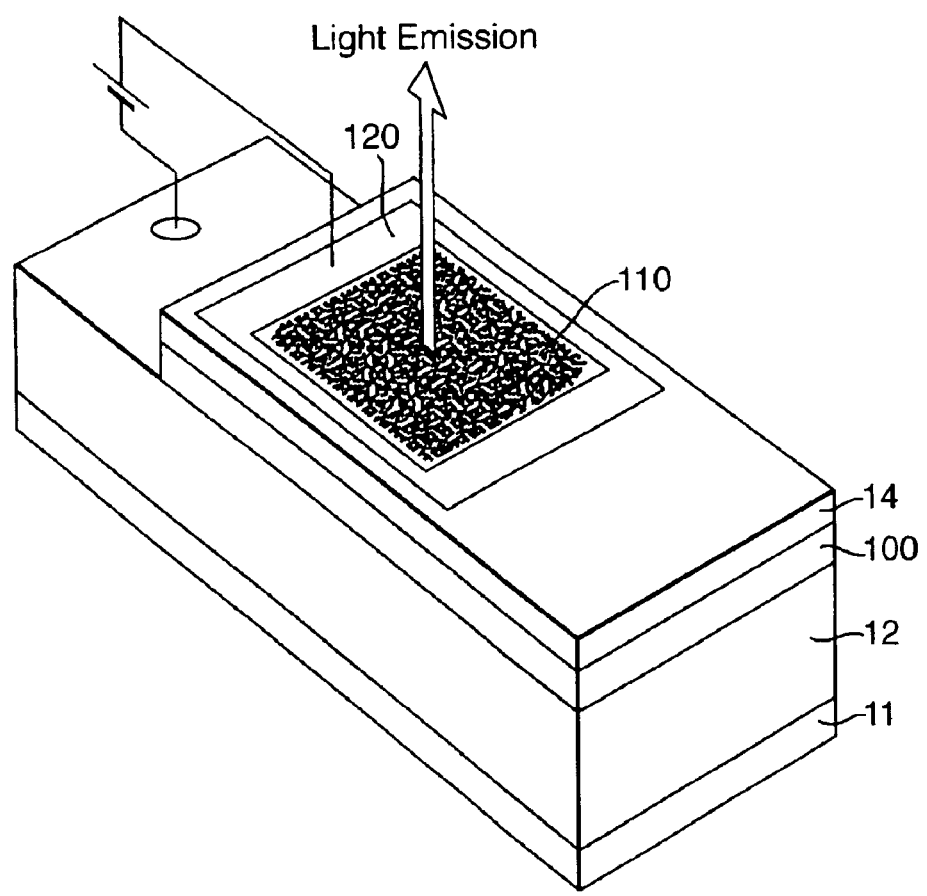
FIG. 12 shows a light emitting diode (LED) in accordance with a ninth aspect of the present invention.

FIG. 12 illustrates a light emitting diode (LED) in accordance with the present invention. The LED is a planar waveguide structure composed an active core layer or multilayer sandwiched between two cladding layers. The core layer may be composed of a material system such as n-doped AlGaAs, GaAs and p-doped AlGaAs (in the order in which they are deposited). The top cladding layer may be composed of p++ AlGaAs and the lower cladding or buffer layer of an n++ doped AlGaAs. Atop metal contact is placed around the pinwheel structure on top of the cladding layer and another on the buffer layer. An electrical signal is applied to the contacts to induce emission. The electrical signal can be modulated if a modulated optical output is required.

The pinwheel structure is designed so that the emission bandwidth of the core layer overlaps regions of low density of states, i.e regions where localisation in the plane of the structure is large. The light is not confined in the vertical direction and hence the light is emitted vertically from the structure, i.e. normal to the plane of the pinwheel structure. The lack of vertical confinement can be achieved by having the localising modes possess effective indexes lower than the buffer and cladding material. An LED made in this way has improved light extraction efficiency. Additionally, the precise definition of the rod diameters and etch depths of the rods provides tunability of the structure. Tuning can improve the efficiency of light extraction into a specific out-of-plane angle.

The present invention may used in a number of optical devices which may be implemented for example in telecommunications systems, in biosensor devices, and in optical storage media as part of an integrated optical system.

What is claimed is:

1. An optical device including an optically localising region comprising a first region having a first refractive index and an array of sub-regions having a second refractive index, the array having a pinwheel tiling structure defined by a plurality of similar triangles, such that the sub-regions in the array are positioned at vertices of the triangles defining the pinwheel tiling structure.

2. An optical device according to claim 1, wherein the localising region is formed in a planar waveguide structure.

3. An optical device according to claim 1, wherein the sub-regions are holes which are formed in the first material.

4. An optical device according to claim 1, wherein the first region is formed from a luminescent material.

5. An optical device according to claim 1, wherein the optical device is a laser device with the localising region formed in a lasing cavity.

6. A laser device according to claim 5, comprising a planar waveguide structure including a cladding layer and a core layer with the pinwheel tiling structure etched through the cladding layer and the core layer.

7. An optical device according to claim 1, wherein the optical device is a laser device with the localising region formed in a lasing cavity and wherein the laser device comprises a waveguide including a core and a cladding.

8. A laser device according to claim 7, wherein the lasing cavity includes lasing mirrors at opposite ends, the lasing mirrors formed by slots cut into the core and the cladding.

9. A laser device according to claim 7, wherein lateral confinement within the lasing cavity is provided by slots cut into the core and the cladding.

10. A laser device according to claim 7, wherein lasing mirrors and lateral confinement is provided by an array of external sub-regions formed in the waveguide core, the array of external sub-regions giving rise to a photonic bandgap.

11. A laser device according to claim 10, wherein the external array is a 1-dimensional array of slots formed in the core.

12. A laser device according to claim 10, wherein the external array is a 2-dimensional array.

13. A laser device according to claim 10, wherein the external array includes a defect giving rise to a narrow pass band within the bandgap.

14. An optical device according to claim 1, wherein the first region is formed of an optically nonlinear material.

15. An optical device according to claim 14, further comprising an optical input and an optical output, wherein the optically localising region exhibits a photonic bandgap, the wavelength range of the photonic bandgap being dependent on the refractive index of the first region.

16. An optical device according to claim 15, the optical device being a clock, wherein, in use, an optical signal of constant amplitude having a wavelength lying inside the bandgap is incident on the optically localising region and is localised thereby; and wherein a change in refractive index of the first region, caused by an accumulation of the localised optical signal, causes the bandgap to change such that the optical signal lies outside the band gap.

17. An optical device according to claim 15, the optical device being a switch and further including an optical data input, an optical data output and a control input, wherein, in use, a control signal effecting a change in refractive index of the first region is input via the control input so as to alter the photonic bandgap to control whether or not the optical data signal is able to pass from the optical data input through the localising region to the optical data output.

18. An optical switch according to claim 17, wherein the control signal is an optical signal.

19. An optical device according to claim 1, wherein the optical device is an optical absorber over a range of wavelengths.

20. A method of processing an optical signal, comprising the step of passing the optical signal through an optical device including an optically localising region comprising a first region having a first refractive index and an array of sub-regions having a second refractive index, the array having a pinwheel tiling structure defined by a plurality of similar triangles, such that the sub-regions in the array are positioned at vertices of the triangles defining the pinwheel tiling structure.

21. A method according to claim 20, wherein the first region is formed from a nonlinear material, further comprising the step of applying a control signal to the optically localising region to affect its optical response.

22. A method according to claim 20, wherein the first region is formed from a nonlinear material, the optically localising region has a photonic bandgap and the optical signal is of constant amplitude having a wavelength lying inside the bandgap wherein a change in refractive index of the first region, caused by an accumulation of the localised optical signal, causes the bandgap to change such that the optical signal lies outside the band gap, giving rise to a pulsed output signal.

23. A method according to claim 20, wherein the first region is formed from a luminescent material.

24. A method of manufacturing an optical device including an optically localising region comprising the steps of:

providing a first region having a first refractive index; and providing an array of sub-regions having a second refractive index, the array having a pinwheel tiling structure defined by a plurality of similar triangles, such that the sub-regions in the array are positioned at vertices of the triangles defining the pinwheel tiling structure.

* * * * *